United States Patent [19]

Hynecek

[11] Patent Number: 5,500,383
[45] Date of Patent: Mar. 19, 1996

[54] METHOD FOR FABRICATING A CCD IMAGE SENSOR WITH ACTIVE TRANSISTOR PIXEL

[75] Inventor: Jaroslav Hynecek, Richardson, Tex.

[73] Assignee: Texas Instruments Incorporated, Dallas, Tex.

[21] Appl. No.: 412,820

[22] Filed: Mar. 29, 1995

Related U.S. Application Data

[62] Division of Ser. No. 48,038, Apr. 14, 1993, Pat. No. 5,436,476.

[51] Int. Cl.⁶ .......................... H01L 21/04; H01L 21/265
[52] U.S. Cl. .......................... 437/53; 437/3; 437/49
[58] Field of Search .................. 437/53, 48, 2, 437/3, 49

[56] References Cited

U.S. PATENT DOCUMENTS

| | | | |
|---|---|---|---|
| 4,074,302 | 2/1978 | Brewer | 257/239 |
| 4,229,752 | 10/1980 | Hynecek . | |
| 4,321,486 | 3/1982 | Boler et al. | 257/229 |
| 4,612,454 | 9/1986 | Kinoshita et al. | 257/229 |
| 4,672,645 | 6/1987 | Bluzer et al. | 257/239 |
| 4,716,466 | 12/1987 | Miida et al. | 257/239 |
| 4,900,688 | 2/1990 | Halvis | 437/53 |
| 4,901,129 | 2/1990 | Hynecek . | |
| 4,984,045 | 1/1991 | Matsunaga | 257/239 |
| 4,992,392 | 2/1991 | Nichols et al. | 437/53 |
| 5,151,380 | 9/1992 | Hynecek | 237/53 |
| 5,229,630 | 7/1993 | Hamasaki | 257/239 |
| 5,290,722 | 5/1994 | Hynecek | 437/53 |
| 5,424,223 | 6/1995 | Hynecek | 437/53 |

OTHER PUBLICATIONS

Jaroslav Hynecek, "Virtual Phase Technology; A New Approach To Fabrication Of Large Area CCDS", *IEEE Transactions on Electron Devices*, vol. ED-28, No. 5, May 1981, pp. 483–489.

Jaroslav Hynecek, "BCMD–AN Improved Photosite Structure For High Density Image Sensors", *IEEE Transactions on Electron Devices*, vol. 38, No. 5, May 1991, pp. 1011–1020.

Primary Examiner—Tom Thomas
Assistant Examiner—Michael Trinh
Attorney, Agent, or Firm—Alan K. Stewart; Richard L. Donaldson; William E. Hiller

[57] ABSTRACT

An image sensor element having at least one charge storage well 70 and 80, charge transfer structures for transferring charge from one charge storage well 70 to another charge storage well 80, and a charge sensor for sensing charge levels in a charge storage well 70 without removing the charge from the well. Other devices, systems and methods are also disclosed.

1 Claim, 6 Drawing Sheets

METHOD FOR FABRICATING A CCD IMAGE SENSOR WITH ACTIVE TRANSISTOR PIXEL

This is a divisional of application Ser. No. 08/048,038—CCD Image Sensor with Active Transistor Pixel, filed Apr. 14, 1993, now U.S. Pat. No. 5,436,476.

FIELD OF THE INVENTION

This invention generally relates to image sensor devices and more particularly to charge coupled devices.

BACKGROUND OF THE INVENTION

Without limiting the scope of the invention, its background is described in connection with virtual phase charge coupled device (CCD) image sensors and bulk charge modulated device (BCMD) image sensors, as an example.

Heretofore, in this field, the virtual phase CCD was developed to provide a single phase CCD comparable in performance to multiphase CCD's while retaining all the advantages of single level structure. See Hynecek, J., "Virtual Phase Charge Transfer Device", U.S. Pat. No. 4,229,752, issued Oct. 21, 1980; and Hynecek, J., "Virtual Phase Technology: A new Approach to Fabrication of Large-Area CCD's", IEEE Transactions on Electron Devices, Vol. ED-28, No. 5, May 1981, which are incorporated herein by reference. The bulk charge modulated device (BCMD) device was developed to achieve optimal imaging performance in all aspects of image sensing. See Hynecek, J., "Bulk Charge Modulated Transistor Threshold Image Sensor Elements and Method of Making", U.S. Pat. No. 4,901,129, issued Feb. 13, 1990; and Hynecek, J., "BCMD—An Improved Structure for High-density Image Sensors", IEEE Transactions on Electron Devices, Vol. 38, No. 5, May 1991, which are incorporated herein by reference.

Charge coupled devices (CCDs) are well known monolithic semiconductor devices and are used in various applications such as shift registers, imagers, infrared detectors, and memories. A virtual phase CCD device contains a single set of gates and a single clocking bias. The virtual phase CCD device operates on the principle of selectively doping different regions of each cell so that clocking the gate affects only the energy bands in a portion of each cell and drives them from below to above the fixed energy bands in the remainder of each cell. The doped region that shields this remainder of a cell from the effect of the clock bias of the gate voltage is normally called the "virtual gate". The virtual gate is a doped region that is built directly into the silicon surface and is biased at the substrate potential. The virtual phase CCD minimizes the possibility for gate-to-gate shorts encountered in previous CCD technologies, and provides high quantum efficiency, excellent uniformity, low dark current, and blemish free imagery.

The BCMD sensor consists of a buried-channel MOS transistor with a specially designed storage well located under the transistor channel in the silicon bulk. When the device is illuminated, charge accumulates in the well and changes the potential profile of the entire structure. This in turn affects the potential of the MOS transistor channel that carries the current. The resulting new level of the channel potential is then simply sensed as a voltage of the source junction of the transistor when the device is connected as a source follower. The well is then easily emptied by applying a large negative pulse to the gate of the transistor. The BCMD well is emptied in the vertical direction to the substrate, whereas charge is emptied from CCD wells in a lateral direction. The resulting BCMD is an X-Y addressable MOS image sensor that has a high-sensitivity low-noise high-blooming overload capability, no detectable smear, and no image lag.

It is well known that image sensors based on the CCD concept provide high performance imaging with minimum fixed pattern noise. On the other hand X-Y addressed sensors such as charge injection devices (CID) and BCMD devices which sense charge in each photosite without any charge transfer have an advantage that they can be read out nondestructively. The nondestructive readout is necessary in devices which are used in still photography or in auto focussing elements or in exposure control elements where the correct integration time is not known before hand. The nondestructive readout can be used to interrogate the sensing element several times to determine in "real time" if enough charge has accumulated for a "good signal" before the element is read out and reset.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
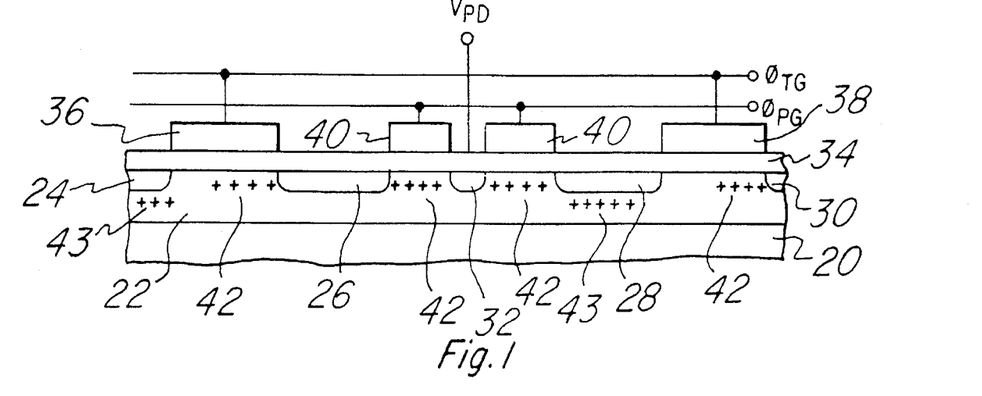
FIG. 1 is a cross-section of a virtual phase CCD element with an active transistor pixel.

FIG. 1 is a cross-section of a preferred embodiment of a virtual phase CCD element with an active transistor pixel. The structure of FIG. 1 includes a P type silicon substrate 20, an N type layer 22 in the substrate 20, P+ virtual phase regions 24, 26, 28, and 30 formed in the upper portion of N type layer 22, P+ source 32 formed in the upper portion of N type layer 22, gate insulator layer 34, transfer gates 36 and 38, transistor gate 40, donor implants 42 in the N type layer 22, transfer gate input ($\phi_{TG}$), transistor gate input ($\phi_{PG}$), and source voltage ($V_{PD}$).

The operation of the device of FIG. 1 will be described below and is illustrated by the potential profile shown in FIG. 2, directly below the corresponding regions of the device of FIG. 1. These regions are given the following names: P+ regions 24, 26, 28, and 30 are called virtual gates (or virtual electrodes) and also serve as a drain for the active transistor, the regions below the virtual gates 26 and 30 are called virtual barriers, the regions below virtual gates 24 and 28 are called virtual wells, the regions below the transfer gates 36 and 38 and below donor implants 42 are called the clocked wells, the regions below the transfer gates 36 and 38 and not below the donor implants 42 are called the clocked barriers, the region below the transistor gate 40 is the transistor gate well, and the region below P+ region 32 is the source.

Figure 3:
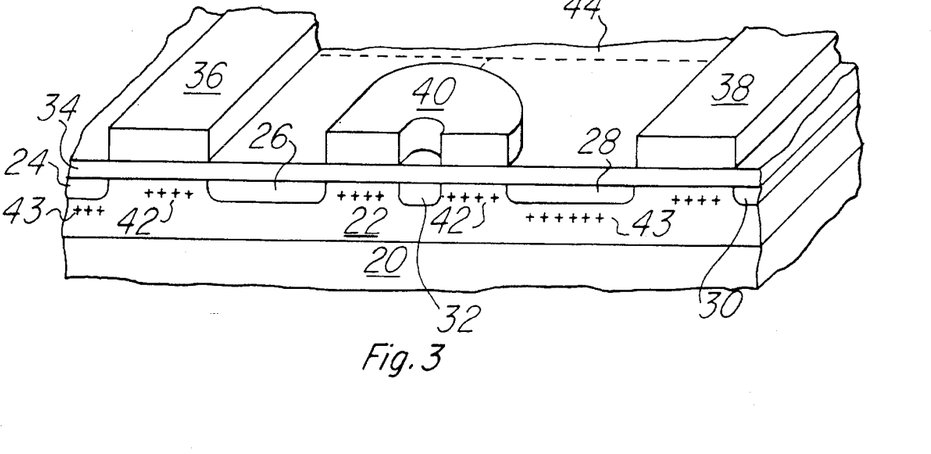
FIG. 3 is a perspective view of the device of FIG. 1.

FIG. 3 is a perspective view of the device of FIG. 1. FIG. 3 shows the top of the device which includes the transfer gates 36 and 38, the transistor gate 40, P+ virtual phase regions 26 and 28, and P+ trench 44. The donor impurities 43 extend under the entire virtual phase region 28. Since the P+ virtual phase regions 26 and 28 are in contact with the P+ trench 44 and the P+ trench 44 is in contact with the substrate 20, the virtual phase regions 26 and 28 are maintained at the substrate potential. Virtual phase regions 24 and 30 are maintained at the substrate potential in the same way as regions 26 and 28. The P+ trench 44 also provides isolation between the CCD columns.

Figure 4:
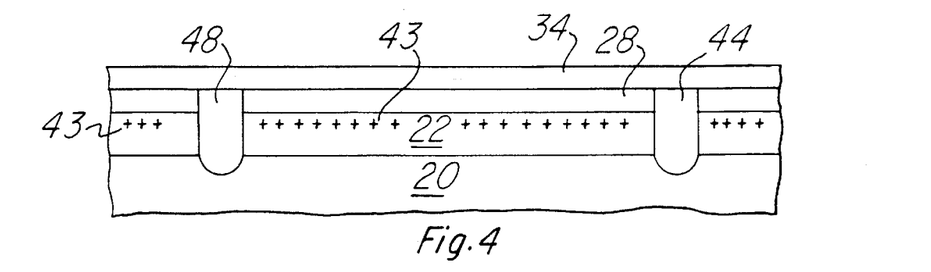
FIG. 4 is a side view cross-section of the device of FIG. 1.

FIG. 4 is a side view of the device of FIG. 3 crossing through the plane A—A' as shown in FIG. 3. FIG. 4 shows the P+ trenches 44 and 48 which connect the virtual phase regions (P+ regions) 24, 26, 28, and 30 to the substrate 20. The structure of FIG. 4 extends further in the A' direction than does the structure in FIG. 3 in order to show the trench 48.

Figure 5:
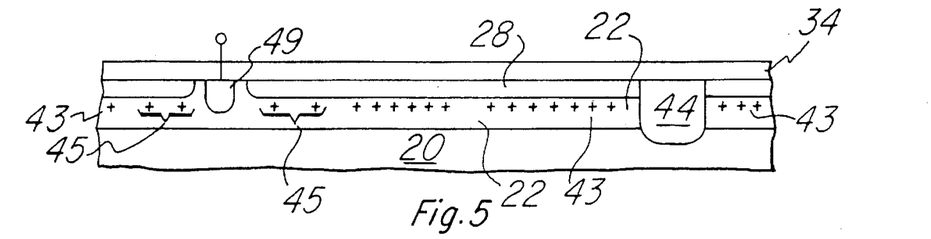
FIG. 5 is a side view cross-section of the device of FIG. 1 showing an antiblooming drain.

Also, an antiblooming drain can be formed in the trench area, as shown in FIG. 5. The antiblooming drain is an alternative embodiment formed in place of the trench 48 in FIG. 4. The antiblooming drain consists of a small N+ region 49, shown in FIG. 5, instead of the larger P+ region 48, shown in FIG. 4. The donor impurities in the area 45 are less than in area 43 to form the potential profile which serves as a charge overflow barrier. When the charge level in the virtual well goes above this overflow barrier, the charge flows over this barrier and into the drain. The antiblooming drain allows excess charge to flow out of the virtual well to prevent the excess charge from spreading to other cells. Other types of antiblooming structures can be formed as well. For example, a structure with a gate controlled antiblooming barrier in place of the implant 45 can be formed.

Figure 6:
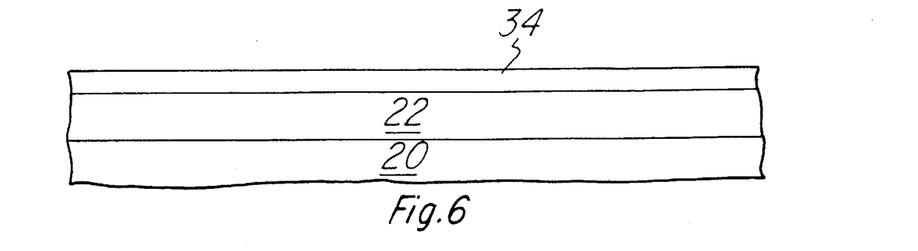
FIGS. 6–8 show the device of FIG. 1 at three stages of fabrication.
Figure 7:
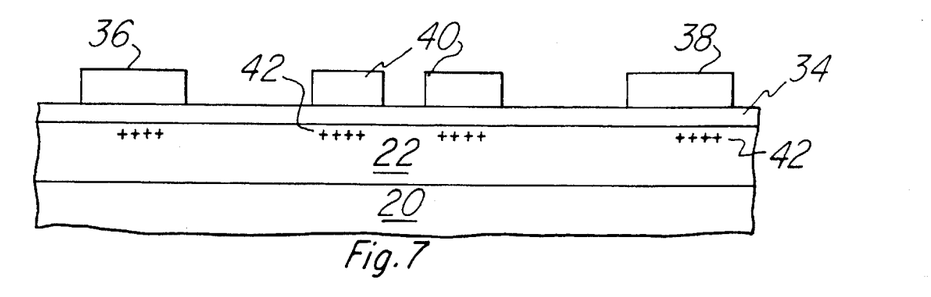
Figure 8:
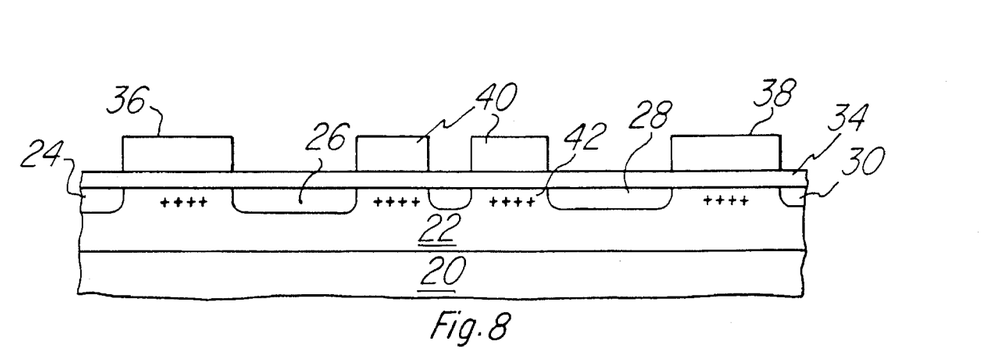

FIGS. 6–8 illustrate successive steps in a process for fabricating an active transistor pixel CCD element, as shown in FIG. 1. Referring first to FIG. 6, an N type layer 22 is implanted in P type semiconductor substrate 20. A dopant such as phosphorus may be used as the implant dopant. Then a gate insulator layer 34 is grown over the surface of the device. The gate insulator layer 34 is preferably formed of oxide and may be grown from the substrate. Next, a photoresist layer is used to pattern an implant into N type layer 22 to form the donor implants 42 shown in FIG. 6. This implant is done with an N type dopant such as phosphorous.

After the photoresist layer is stripped, the transistor gate 40 and the transfer gates 36 and 38 are deposited, doped to be conductive, patterned, and etched as shown in FIG. 7. The transistor gate 40 and the transfer gates 36 and 38 can be polysilicon, in which case they may be doped in place by a dopant such as phosphoric oxytrichloride ($POCl_3$). Next, the transistor gate 40 and the transfer gates 36 and 38 are used for a self-aligned implantation step to form P+ source 32 and P+ drain regions (virtual phase regions) 24, 26, 28, and 30, as shown in FIG. 8. This implant is done with a P type dopant such as boron. Then a photoresist layer is used to pattern an implant to form the donor implants 43 shown in FIG. 1. This implant is done with an N type dopant such as phosphorous.

The operation of the device shown in FIGS. 1, 3, and 4 consists of two steps. In the first step, the device integrates the charge signal generated by incident light into the device while the level of charge is being nondestructively interrogated. After the signal reaches a satisfactory level, charge is transferred out from the device of FIG. 1 into a CCD memory and is read out destructively with a high accuracy and uniformity.

During charge integration the transfer gates 36 and 38 are biased negative which separates individual active transistors. The transistor is a P-channel MOS device with enclosed source 32 and drain common to virtual phase regions 26 and 28. If the source 32 is biased by a constant current source from a power supply, the potential of the source 32 will adjust itself to a level which will be sensitive to charge in the transistor region. This is similar to BCMD operation. The P-channel transistor operates in a source follower mode with the gate-source threshold determined by the doping profiles of the structure and by the amount of electrons under the transfer gates 36 and 38.

During nondestructive readout, the transistor gate 40 and the transfer gates 36 and 88 are biased as follows: the transfer gates 36 and 88 are negative to separate the pixels and the transistor gate 40 is addressed either high or mid level. If the transistor gate 40 is biased mid level, the cell is selected. If the transistor gate 40 is biased high, it is not selected.

During nondestructive readout the fixed pattern noise caused by transistor threshold variations is not important since the array is used only to find a suitable integration time and to make a rough measurement of the charge level. However, various fixed pattern noise subtraction schemes can be used to subtract fixed pattern noise if necessary. After the integration is completed, the charge signal is read out more accurately by the CCD action.

During charge transfer, the transistor gate 40 and the transfer gates 36 and 38 are clocked out of phase to accomplish a CCD charge transfer. During this phase the device functions as a standard CCD device. Several types of CCD architectures can be used such as frame transfer, interline transfer, frame-interline transfer, full frame, charge sweep device, and line addressable device.

Figure 2:
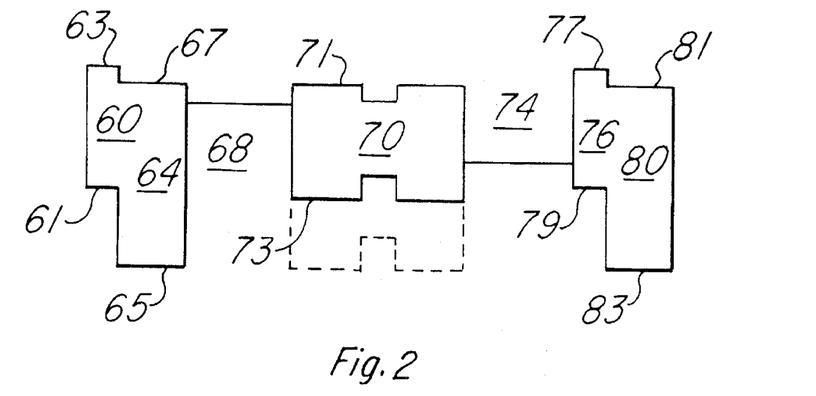
FIG. 2 is a diagram of the potential wells created by the device of FIG. 1.

The operation of the device of FIG. 1 during charge transfer is explained by referring to the potential profile shown in FIG. 2. The energy levels for an electron in the buried channel (conduction band minimum) are shown for the various regions of the device and for different bias levels of the transfer gates 36 and 38, and different bias levels of the transistor gate 40. Starting with an electron in the clocked barrier 60 at level 61 below transfer gate 36 with the transfer gate bias approximately equal to substrate bias, the operation is as follows. First the electron falls into the clocked well 64 at level 65. The electron will remain in the clocked well 64 as long as the transfer gate bias is approximately equal to substrate bias because the potential wells of both adjacent regions are higher. When the transfer gate 36 is switched to a negative bias with respect to the substrate 20, the potential level of the clocked well 64 moves up to level 67 and the potential level of clocked barrier 60 moves up to level 63. Then the electron passes from the clocked well 64 to the virtual barrier 68. The electron then moves from the virtual barrier 68 into the transistor gate well 70 at level 73.

When the transistor gate bias returns to a more negative voltage, the electron passes from the transistor gate well 70 to the virtual well 74 as the transistor gate well moves from potential level 73 to level 71. The electron remains in the virtual well 74 until the transfer gate bias moves to a more positive value which lowers the potential of clocked barrier 76 from level 77 to level 79 which is below the potential of the virtual well 74, and also lowers the potential of the clocked well 80 from potential level 81 to level 83. When the transfer gate bias is switched to this more positive value, the electron passes through the clocked barrier 76 and into the clocked well 80 at level 83. Movement of the electron to further cells is just a repeat of the same steps and clocking of the transfer gates 36 and 38, and the transistor gate 40 as described above.

Figure 9:
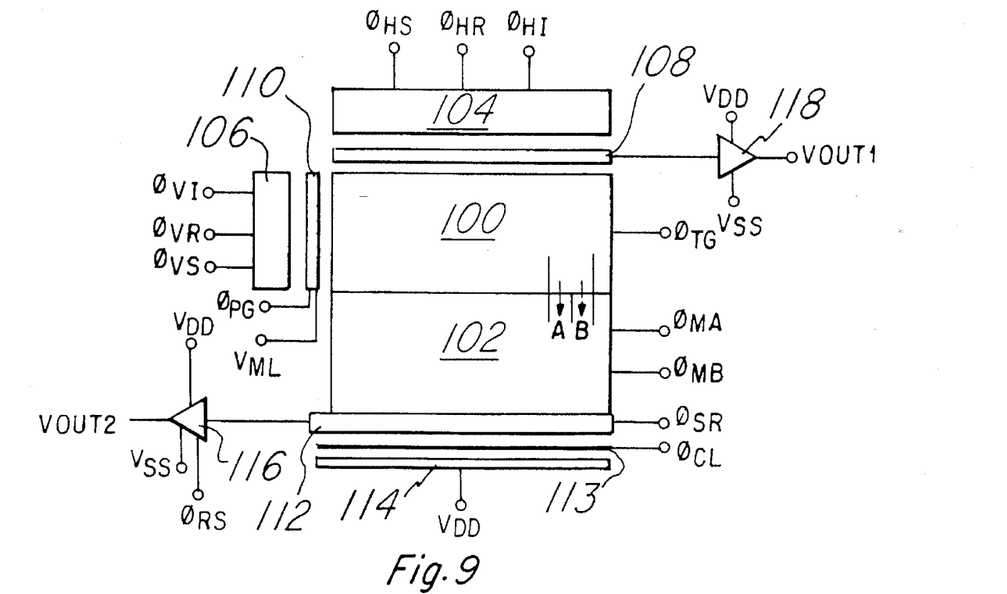
FIG. 9 is a diagram of a CCD array with a CCD sensor array having vertical and horizontal shift registers and a CCD memory array.

A schematic block diagram representation of a first preferred embodiment of a basic sensor system architecture for an active transistor pixel CCD is depicted in FIG. 9 and incorporates the structure of FIGS. 1, 3, and 4. The system includes image sensing area 100, dual field CCD memory area 102, horizontal shift register 104, vertical shift register 106, horizontal switches 108, vertical switches 110, serial CCD register 112, clearing gate 113, charge clearing drain 114, and charge detection amplifiers 116 and 118.

Figure 11:
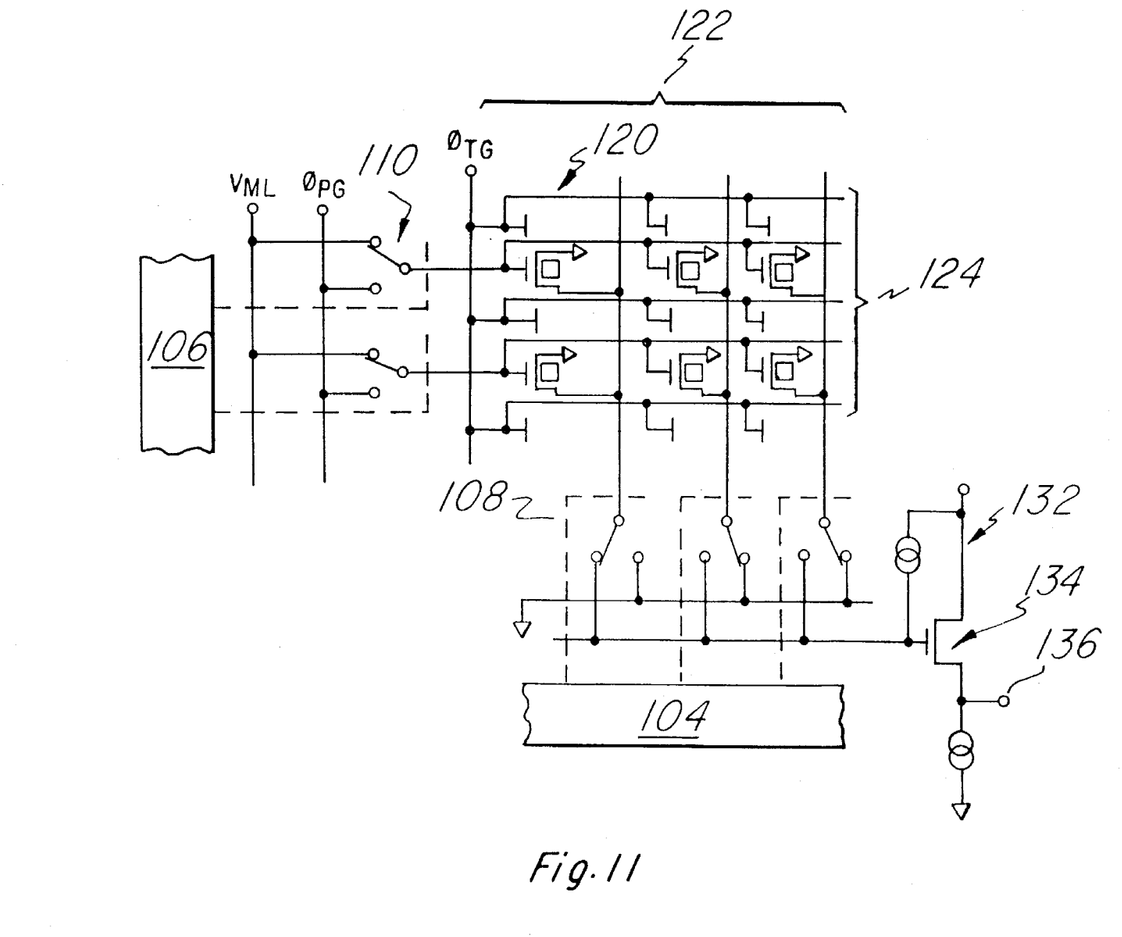
FIG. 11 is a circuit diagram of an array using the CCD element of FIG. 1.

FIG. 11 is a detailed circuit diagram of the image sensing area 100 along with the horizontal shift register 104, horizontal switches 108, vertical shift register 106, and the vertical switches 110, shown in FIG. 9. The circuit includes vertical shift register 106, horizontal shift register 104, photosites 120 (the device of FIG. 1), array columns 122 (X-address), array lines 124 (Y-address), vertical switches 110, horizontal switches 108, transfer gate voltage ($\phi_{TG}$), charge transfer input ($\phi_{PG}$) to transistor gates, transistor mode input ($V_{ML}$) to transistor gates, and output circuit 132 with output transistor 134.

In the circuit of FIG. 11, the vertical shift register 106 is used to select an array line for nondestructive readout of the active transistor in the photosites. The vertical shift register 106 selects the vertical switches in sequential order. Each vertical switch is connected to all of the transistor gates in the corresponding line of the array. The horizontal shift register 104 selects an array column for nondestructive readout. The horizontal shift register 104 selects the horizontal switches in sequential order. Each horizontal switch is connected to all of the transistor sources in the corresponding column of the array. The nondestructive output is taken from line 136 of the output circuit 132.

One purpose of the nondestructive readout is to determine the optimum charge integration time. As incident light causes charge to build up in the device, the active transistor element can be sensed to measure the level of charge building up in the device. The charge level is sensed from the source of the transistor. The use of the transistor to detect the charge level will have minimal effect on the charge that has already built up. Once the charge has reached the desired level, the charge can then be transferred in CCD mode to the memory array. This process will allow the charge integration time to be optimized before the charge is transferred from the image sensing array to the memory array.

In the CCD array shown in FIG. 9, the dual field CCD memory area 102 is constructed such that it can accept charge from one channel and direct it either to the memory "A" or "B". This dual feature allows for field signal subtraction. If one field is with signal and the other without (just the background), the subtraction is easily accomplished during the readout. Two consecutive charge signals are subtracted. The time domain sequential subtraction reduces problems with amplifier mismatch and balance if two channels and a dual amplifier system is used.

Figure 10:
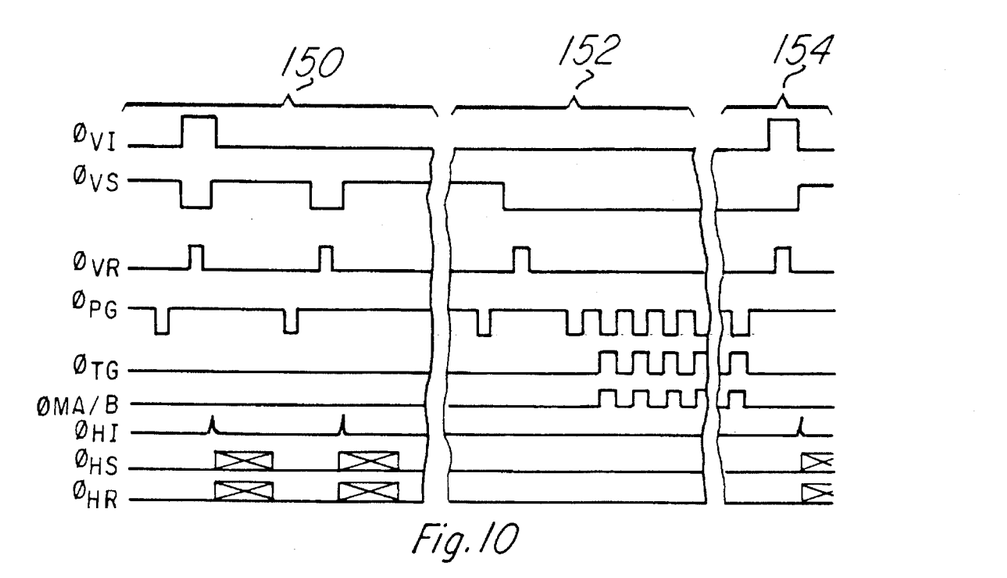
FIG. 10 is a timing diagram showing the various inputs to the device of FIG. 9.

FIG. 10 is a timing diagram showing the various inputs to the device of FIG. 9. $\phi_{Vi}$ is the input which starts the vertical shift register. $\phi_{V8}$ is the input to the vertical clock. $\phi_{Vr}$ is the input to the vertical reset clock. $\phi_{Pg}$ is the photogate pulse to bias the gate for readout. $\phi_{Tg}$ is the charge transfer pulse. $\phi_{MA/B}$ is the memory A and B pulses. $\phi_{Hi}$ is the input for the horizontal scan start. $\phi_{Hs}$ is the horizontal scan pulses. $\phi_{Hr}$ is the horizontal reset pulses. Horizontal CCD register pulses are not included in this timing diagram.

The timing cycle starts with a charge clearing period from the image sensing area 100 and the memory areas 102. Charge is dumped into the charge clearing drain 114 located below the serial register 112. In this interval clocking pulses are similar to the charge transfer to memory cycle.

After the charge clearing period, the charge integration and nondestructive readout period 150 follows. This interval is as long as necessary to integrate a sufficient amount of charge in the pixels. The sufficient mount is determined in the external circuitry by supplying the nondestructive signal to it. External circuits determine when to stop the integration and proceed with the next cycle.

Next is charge transfer to memory 152. During this interval the device operates in a standard CCD mode. This interval can be followed by another integration period 154 and transfer cycle of identical length but with the light source turned off to load memory "B" with the background information for subtraction.

After both memories "A" and "B" are loaded with the corresponding signals, the data is transferred into the serial register 112 and read out. This is performed in a serial fashion with pixel by pixel analog subtraction. The serial register 112 shifts the charge serially into the charge detection amplifier 116. Serial readout is common to all CCD devices. This is not shown on the timing diagram in FIG. 10.

Vertical as well as horizontal switches and shift registers are typically built using CMOS devices. It is therefore beneficial to integrate CMOS and CCD architectures into a single process.

Figure 12:
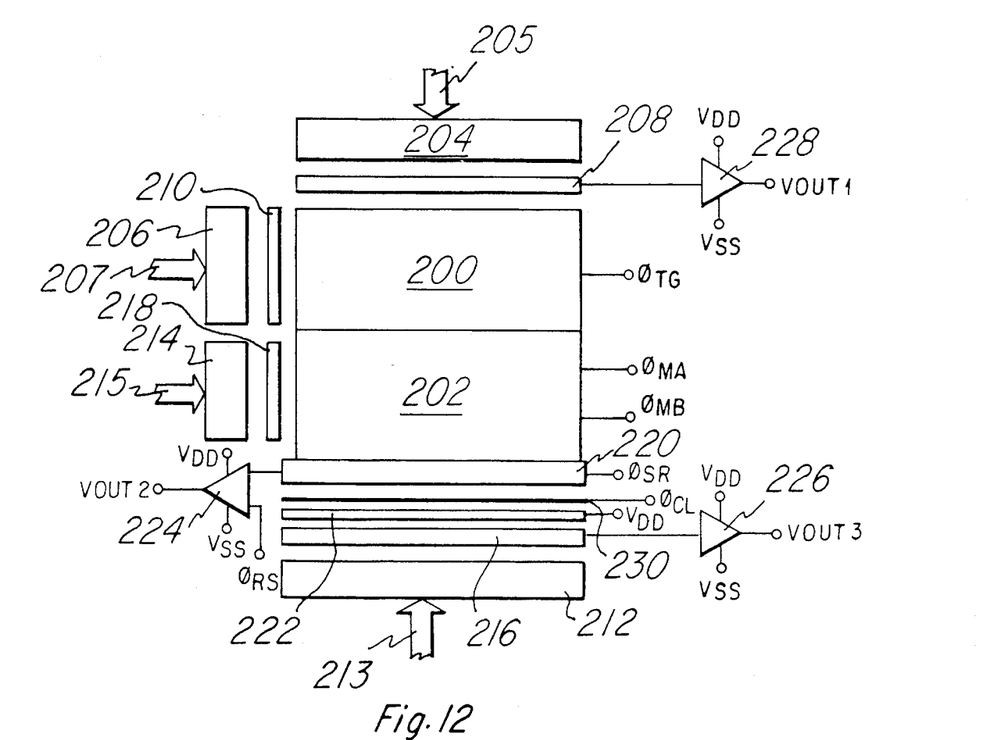
FIG. 12 is a diagram of a CCD array with a CCD sensor array having vertical and horizontal decoders and a CCD memory array having vertical and horizontal decoders.

A schematic block diagram representation of a second preferred embodiment of a basic sensor system architecture for an active transistor pixel CCD is depicted in FIG. 12 and incorporates the structure of FIG. 1. The system includes image sensing area 200, field memory area 202, horizontal decoder 204 to the image sensing area 200, vertical decoder 206 to the image sensing area 200, horizontal switches 208 for the image sensing area 200, vertical switches 210 for the image sensing area 200, horizontal decoder 212 to the memory area 202, vertical decoder 214 to the memory area 202, logic input 205 to horizontal decoder 204, logic input 207 to vertical decoder 206, logic input 213 to horizontal decoder 212, logic input 215 to vertical decoder 214, horizontal switches 216 for the memory area 202, vertical switches 218 for the memory area 202, serial register 220, clearing gate 230, charge clearing drain 222, and charge detection amplifiers 224, 226, and 228.

The difference between the system of FIG. 12 and the system of FIG. 9 is that the shift registers of the system in FIG. 9 have been replaced by decoders in the system of FIG. 12. Also, the active transistor pixel (ATP) CCD is used in the field memory area 202 as well as in the image sensing area 200. The decoders 212 and 214 in the memory area 202 are used for the ATP CCD in the memory area.

The use of decoders in the system of FIG. 12 instead of shift registers, as in the system of FIG. 10, allows the cells in the array to be non-destructively read out in any order. With the decoders each cell can be selected directly without having to scan through the other cells as with the shift registers. This provides more flexibility in the operation of the system. For example, the decoders allow a coarse readout of the array by reading out only selected cells in the array.

For a coarse readout, the array can be divided into several regions with each region consisting of more than one ATP CCD cell. Then each region can be coarsely monitored by reading only one cell in that region. The output from the selected cell will be compared to a threshold level. Then only those regions of the array having a selected cell with an output above the threshold will be read out in CCD mode. The contents of the other regions of the array will be discarded. This process will save time in the readout of the device because only those parts of the memory with significant information will be read out.

This coarse readout process can be used in either the image sensor array area 200 or the memory area 202. If used in the image sensor area 200, only the regions of the image sensor array above the threshold will be transferred to the memory array 202, then only that data will be transferred out of the memory array 202. If this coarse readout process is done only in the memory array 202, then all of the data in the image sensor array cells will be transferred to the memory array 202. Then the memory array 202 will be coarsely scanned to determine which cells to read out in CCD mode.

In another technique for a coarse readout, the array can be divided into regions and the transistors in each region can all be connected together to determine the charge level in each region. For each cell in a region to be weighted evenly with the other cells in that region, all the transistors in a region can be shorted together. In this way, the signals from all the cells in a region will be treated equally. For situations where some cells need to be weighted more heavily than others, the transistors can be connected together through resistive networks that provide the desired weighting between the cells.

The image sensor array 200 of FIG. 10 can also be scanned to determine optimum charge integration time as described above for the device of FIG. 9. With the decoders, there is more flexibility in selecting array cells for determining optimum charge integration time. The cells in the array can be selected in any order and in any area of the array. Also, any number of the cells in the array can be selected for determining charge integration time. For a coarse determination, only a small number of cells can be measured in selected areas of the array. For a fine determination, more cells can be measured.

This invention incorporates both the CCD transfer as well as nondestructive X-Y addressable capability into a single pixel of an imaging device. This provides several advantages. One advantage of the invention is that the nondestructive X-Y addressable capability can be used to interrogate the sensing element several times to determine in real time if enough charge has accumulated for a good signal before the element is read out and reset. Another advantage of the invention is provided by the ability to scan the image sensing array to determine which elements in the array have sufficient charge levels so that only those elements with sufficient charge levels will be read out. This advantage reduces read out time of the device. Another advantage of the invention is the ability to have the nondestructive read out capability in the memory array as well as in the image sensing array. The memory array can be scanned to determine which elements in the memory array have sufficient charge levels so that only those elements with sufficient charge levels will be read out. This advantage also reduces read out time of the device.

The nondestructive X-Y addressable capability also allows the array to be coarsely scanned by measuring only selected elements located at strategic positions in the array. In this mariner, the array can be quickly scanned to determine which regions of the array have sufficient charge levels for read out. Then, in order to reduce read out time, only those regions of the array with sufficient charge levels will be read out. This coarse scanning technique can be accomplished in either the image sensing array or the memory array.

A few preferred embodiments have been described in detail hereinabove. It is to be understood that the scope of the invention also comprehends embodiments different from those described, yet within the scope of the claims.

For example, the cells can be connected through logic networks that perform arithmetic operations such as the sum, difference, and division. The signals from the transistors in the array can also be input into a processor for performing arithmetic operations on the signals to determine the status of the signal levels in the array.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an active transistor pixel charge coupled device comprising:

forming a semiconductor substrate of a first conductivity type;

forming a semiconductor layer of a second conductivity type in the substrate;

forming virtual phase regions of the first conductivity type in the semiconductor layer, the virtual phase regions forming virtual phase potential wells for carriers of the second conductivity type;

forming a transistor source region of a first conductivity type in the semiconductor layer and spaced apart from the virtual phase regions;

forming an insulating layer on the semiconductor layer;

forming a transistor gate electrode on the insulating layer and located above the semiconductor layer surrounding the transistor source region and between virtual phase regions, the transistor gate electrode forming a transistor potential well for carriers of the second conductivity type in response to a voltage;

forming transfer gate electrodes above the insulating layer and separated from the transistor gate electrode by the virtual phase regions, the transfer gate electrodes forming transfer potential wells for carriers of the second conductivity type in response to a voltage.

\* \* \* \* \*